United States Patent [19]

Kawano

[11] Patent Number: 5,783,947
[45] Date of Patent: Jul. 21, 1998

[54] SEMICONDUCTOR INTEGRATED CIRCUIT

[75] Inventor: Harumi Kawano, Miyazaki, Japan

[73] Assignee: Oki Electric Industry Co., Ltd., Tokyo, Japan

[21] Appl. No.: 838,988

[22] Filed: Apr. 23, 1997

Related U.S. Application Data

[62] Division of Ser. No. 515,581, Aug. 16, 1995, Pat. No. 5,672,982.

[30] Foreign Application Priority Data

Aug. 30, 1994 [JP] Japan ..................... 6-204728

[51] Int. Cl.$^6$ ..................... G01R 31/26
[52] U.S. Cl. ..................... 324/765
[58] Field of Search ..................... 324/765, 768, 324/769; 327/51, 52, 56, 77, 78, 88, 89, 563

[56] References Cited

U.S. PATENT DOCUMENTS

| | | |
|---|---|---|
| 5,371,457 | 12/1994 | Lipp . |
| 5,440,253 | 8/1995 | Araya ..................... 327/69 |
| 5,508,649 | 4/1996 | Shay ..................... 327/318 |
| 5,712,857 | 1/1998 | Whitman et al. ..................... 371/22.1 |

FOREIGN PATENT DOCUMENTS 0 386 804  9/1990  European Pat. Off. .

OTHER PUBLICATIONS

Nikkei Electronics, Aug. 6, 1992, No. 556, pp. 133–141.
Journal of Electronic Testing, vol. 3, No. 4, Dec. 1992, Dordrecht NE, pp. 111–120, W. Maly et al., "Design of ICs applying Built–In Current Testing".

1993 IEEE International Test Conference, Oct. 3, 1993, Cambridge, MA, USA, pp. 596–600, F. Vargas et al., "Quiescent Current Monitoring to Improve the Realiability of Electronics Systems in Space Radiation Environments".

Primary Examiner—Ernest F. Karlsen
Assistant Examiner—Russell M. Kobert
Attorney, Agent, or Firm—Rabin & Champagne, P.C.

[57] ABSTRACT

An object of the present invention is to make it easy to realize a method of measuring a current which flows upon deactivation of a semiconductor integrated circuit in order to test whether a damaged transistor exists in the semiconductor integrated circuit.

In order to achieve the above object, the present invention provides a semiconductor integrated circuit comprising an input node supplied with an input voltage, a reference node supplied with a reference voltage, a first source potential node supplied with a first source potential level, a second source potential node supplied with a second source potential level, a sense circuit connected between the first source potential node and the second source potential node and brought into an operating state during a period in which the first source potential level is supplied, the sense circuit comparing the input voltage and the reference voltage and outputting the result of comparison to a first node, a buffer circuit connected between the first node and an output node and adapted to output a voltage corresponding to the voltage appearing at the first node to the output node, and a first switching circuit connected between the first source potential node and the sense circuit and adapted to selectively connect between the sense circuit and the first source potential node in response to the voltage supplied to the reference node.

5 Claims, 12 Drawing Sheets

SEMICONDUCTOR INTEGRATED CIRCUIT

This is a Division of allowed application Ser. No. 08/515,581, filed Aug. 16, 1995 now U.S. Pat. No. 5,672,982.

BACKGROUND OF THE INVENTION

1. Field of the Invention

This invention relates to a semiconductor integrated circuit including a sense circuit capable of handling an input signal whose amplitude is small.

2. Description of the Related Art

An input buffer circuit capable of handling a signal whose amplitude is small, has been required as one technique (disclosed in, for example, a technical literature I ("Nikkei Electronics", no. 556, pp. 133-141, Jun. 8, 1992)) for realizing a semiconductor integrated circuit activated at higher speed. An example in which a semiconductor integrated circuit having an input buffer circuit incorporated therein and called a "GTL" (Gunning Transceiver Logic) as one example, is constructed, has been disclosed on page 136 of the technical literature I in particular. FIG. 13 is a circuit diagram showing the input buffer circuit called the "GTL". The input buffer circuit comprises a terminal (input terminal) IN to which an input signal whose amplitude is small is supplied, a sense circuit (sense amplifier) 20 composed of P-channel MOS (Metal Oxide Semiconductor) field effect transistors (also hereinafter called "P-MOSs") 21, 22 and 23 and N-channel MOS field effect transistors (also hereinafter called "N-MOSs") 24 and 25, a reference voltage supply terminal REF and an output terminal OUT. In the input buffer circuit, a signal N21 of a low or high level is outputted depending on whether a voltage inputted to the input terminal IN is higher or lower than a voltage at the reference voltage supply terminal REF. The low or high level signal N21 is transmitted to an output terminal OUT through both an inverter circuit INV composed of a P-MOS 26 and N-MOSs 27 and 28, and inverters 29 and 30. Incidentally, the N-MOS 27 in the inverter circuit INV is of a transistor for taking countermeasures against hot carriers. Further, the reference voltage is determined as 0.8V and the input voltage is determined so as to range from about 0V to 1.2V in accordance with the GTL standards.

A test for measuring a current flowing from a power source to GND in a state in which a predetermined quiescent test signal has been applied to a terminal of a semiconductor integrated circuit, a so-called method of measuring a current that flows upon deactivation of the semiconductor integrated circuit, is carried out as a on-shipment test when the semiconductor integrated circuit is shipped. This is carried out because the result of measurement can be used as one criteria for judging whether damaged or broken spots exist in transistors employed in the semiconductor integrated circuit. Even in the case of a semiconductor integrated circuit provided with the input buffer circuit shown in FIG. 13 as an input portion, a current that flows upon deactivation of the semiconductor integrated circuit, is measured for the purpose of testing a principal portion of the semiconductor integrated circuit upon shipment thereof. Since, however, the amplitude of an input signal is smaller than that of a power source voltage in the input buffer circuit, the P-MOSs 21, 22 and 23 and the N-MOSs 24 and 25 are kept ON at all times. Therefore, a current i21 (see FIG. 13) always flows in a sense circuit 20 upon measuring the current that flows when the semiconductor integrated circuit is deactivated. When the current that flows upon deactivation of the semiconductor integrated circuit, is measured, this current i21 makes it difficult to make a decision as to whether damaged or broken spots exist in the transistors employed in the semiconductor integrated circuit.

In order to avoid the above problem, it is considered that the consumed current i21 is prevented from flowing on condition that the input voltage at the input terminal IN is $V_{DD}$ and the P-MOS 21 is in an OFF state. Since, however, the P-MOS 22 and the N-MOS 24 are respectively brought into an OFF state at this time, the signal N21 is brought into a high impedance state (floating state). Therefore, a current flows which is consumed by the inverter circuit INV composed of the P-MOS 26 and the N-MOSs 27 and 28. Upon measurement of the on-deactivation current, the current consumed by the inverter circuit INV makes it difficult to judge whether the damaged or broken spots exist in the transistors employed in the semiconductor integrated circuit.

SUMMARY OF THE INVENTION

An object of the present invention is to make it easy to realize a method of measuring a current which flows upon deactivation of a semiconductor integrated circuit in order to test whether a damaged or broken transistor exists in the semiconductor integrated circuit.

According to one aspect of the present invention, for achieving the above object, there is provided a semiconductor integrated circuit comprising an input node supplied with an input voltage, a reference node supplied with a reference voltage, a first source potential node supplied with a first source potential level, a second source potential node supplied with a second source potential level, a sense circuit connected between the first source potential node and the second source potential node and brought into an operating state during a period in which the first source potential level is supplied, the sense circuit comparing the input voltage and the reference voltage and outputting the result of comparison to a first node, a buffer circuit connected between the first node and an output node and adapted to output a voltage corresponding to the voltage developed at the first node to the output node, and a first switching circuit connected between the first source potential node and the sense circuit and adapted to selectively connect between the sense circuit and the first source potential node in response to the voltage supplied to the reference node.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Figure 1:
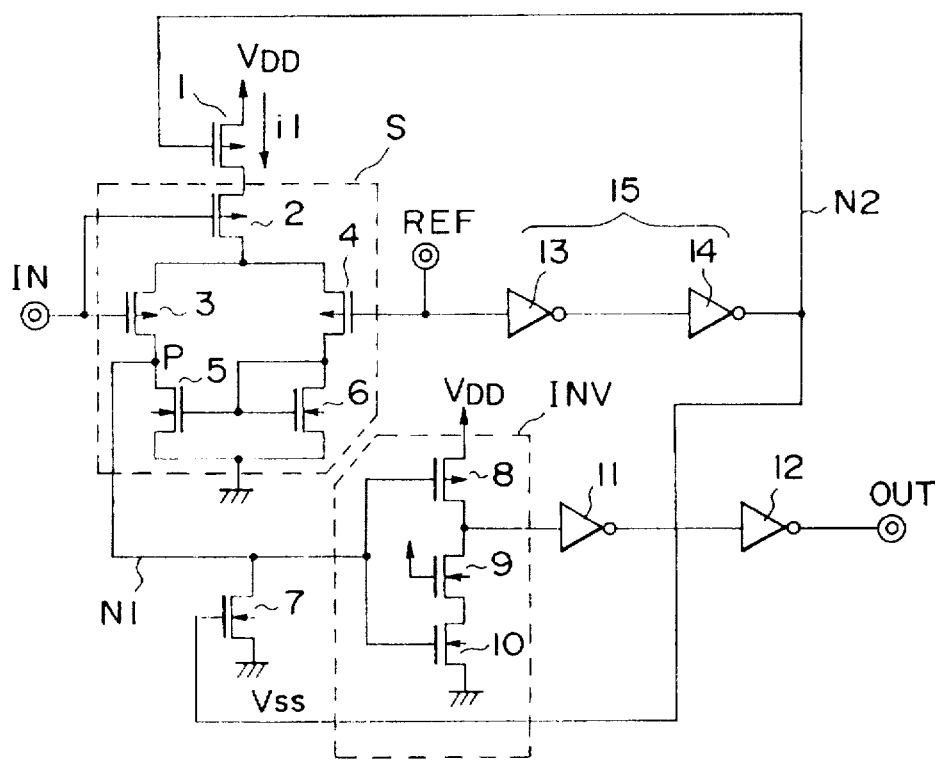
FIG. 1 is a view showing a first embodiment of the present invention.

Preferred embodiments of the present invention will hereinafter be described in detail with reference to the accompanying drawings. Incidentally, the drawings used for purposes of illustration respectively show input buffer circuits each employed in a semiconductor integrated circuit according to the present invention. Further, the elements of structure similar to those in the individual drawings used for illustration are identified by like reference numerals.

[FIRST EMBODIMENT]

FIG. 1 shows an input buffer circuit employed in a semiconductor integrated circuit according to a first embodiment of the present invention.

The semiconductor integrated circuit according to the first embodiment comprises an input terminal IN, a sense circuit (sense amplifier) S, a reference voltage supply terminal REF, an inverter circuit INV, a P-MOS 1 which serves as a first switching element or device, an N-MOS 7 which serves as a second switching device, inverters 11 and 12, inverters 13 and 14, and an output terminal OUT.

Now, the sense circuit S is composed of a P-MOS differential amplifier circuit which comprises P-MOSs 2, 3 and 4 and N-MOSs 5 and 6 (the relationship of electrical connections among these components will be described later). Further, the inverter circuit INV is composed of a P-MOS 8 and N-MOSs 9 and 10. The N-MOS 9 of the inverter circuit INV is of a transistor used for taking measures against hot carriers. The P-MOS 1 serving as the first switching device is of a switching element or device which is turned ON when a reference voltage is applied to the reference voltage supply terminal REF and which is turned OFF when a power source voltage is supplied to the reference voltage supply terminal REF. The N-MOS 7 serving as the second switching device is of a switching device actuated complementary to the first switching device. The inverters 13 and 14 are respectively composed of transistors in the present embodiment. The inverters 13 and 14 constitutes a controller 15 for generating a control signal for controlling the operation of each of the P-MOS 1 and the N-MOS 7 respectively serving as the first and second switching devices, based on the voltage supplied to the reference voltage supply terminal REF. The controller 15 converts the reference voltage into a voltage level capable of driving the P-MOS 1 and the N-MOS 7. Here, the reference voltage and the power source voltage are respectively regarded as 0.8 and 3.3V. Further, an input voltage ranges from 0V to 1.2V. Incidentally, ratios between gate widths of a P-MOS and an N-MOS of the inverter 13 and gate lengths thereof are respectively set to small values as compared with other transistors. As a result, the transistor of the inverter 13 is reduced in dimensions. This is indented to reduce current consumption of the semiconductor integrated circuit at the time that it is normally activated.

A description will now be made of a detailed relationship of the electrical connections among the components shown in FIG. 1. The input terminal IN is electrically connected to both gates of the P-MOSs 2 and 3. The P-MOS 1, which serves as the first switching device, is provided between a power source $V_{DD}$ and the sense circuit S. Described more specifically, the source of the P-MOS 1 is electrically connected to the power source $V_{DD}$ and the drain thereof is electrically connected to the source of the P-MOS 2 which serves as a constant-current power supply in the sense circuit S. Further, the gate of the P-MOS 1, which corresponds to a control terminal, is electrically connected to the reference voltage supply terminal REF through the inverters 14 and 13. Now, a signal which appears at an output terminal of the inverter 14, will be regarded as N2 below. In the sense circuit S, the drain of the P-MOS 2 is electrically connected to both sources of the P-MOSs 3 and 4. The drain of the P-MOS 3 is electrically connected to the drain of the N-MOS 5. Now, a signal, which appears at a point or node where both drains of the P-MOS 3 and the N-MOS 5 are coupled to each other, will be regarded as 1 below. The gate of the N-MOS 5 is electrically connected to the gate and drain of the N-MOS 6 and the drain of the P-MOS 4. Both sources of the N-MOSs 5 and 6 are electrically connected to a ground potential. The gate of the P-MOS 4 is electrically connected to the reference voltage supply terminal REF. The N-MOS 7 is provided between the output of the sense circuit S and the ground potential. Described in detail, the drain of the N-MOS 7 is electrically connected to the common junction point P between the drain of the P-MOS 3 and the drain of the N-MOS 5. Further, the source of the N-MOS 7 is electrically connected to the ground potential. The gate of the N-MOS 7 is electrically connected to the reference voltage supply terminal REF through the inverters 14 and 13. A signal conductor or line on which the signal N1 appears, is electrically connected to the gates of the P-MOS 8 and the N-MOS 10 in the inverter circuit INV. The source of the P-MOS 8 in the inverter circuit INV is electrically coupled to the power source potential $V_{DD}$, whereas the drain thereof is electrically coupled to the drain of the N-MOS 9 and the input of the inverter 11. The gate of the N-MOS 9 in the inverter circuit INV is electrically connected to the power source potential $V_{DD}$, whereas the source thereof is electrically connected to the drain of the N-MOS 10. Further, the source of the N-MOS 10 is electrically coupled to the ground potential $V_{SS}$. The output of the inverter 11 is electrically connected to the input of the inverter 12, whereas the output of the inverter 12 is electrically connected to the output terminal OUT.

Figure 2:
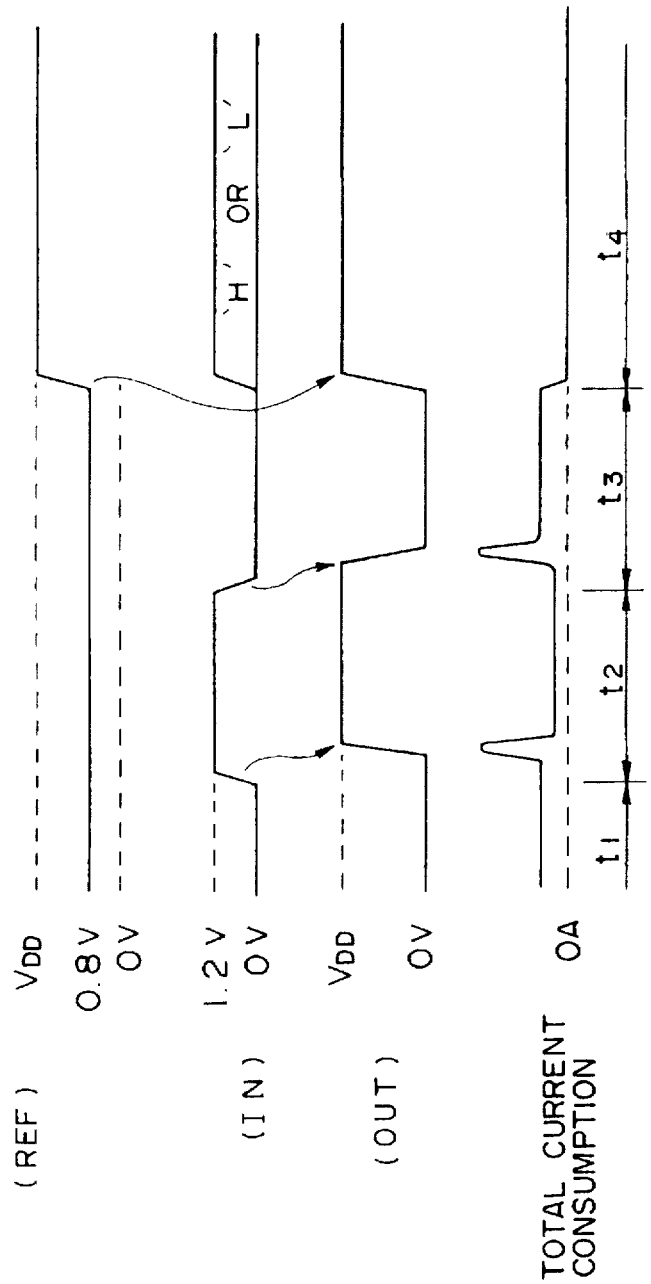
FIG. 2 is a timing chart for describing the operation of the first embodiment of the present invention.

The operation of the semiconductor integrated circuit according to the first embodiment and a method of measuring a current that flows upon deactivation of the semiconductor integrated circuit, will now be described with reference to FIGS. 1 and 2. FIG. 2 is a timing chart for describing the operation of the circuit shown in FIG. 1. FIG. 2 also shows the manner in which a current used up by the circuit varies with time.

A description will first be made of a circuit operation at the time that an input signal rises when the semiconductor integrated circuit is normally activated. Incidentally, the voltage applied to the reference voltage supply terminal REF is set to 0.8V from the specifications of GTL. Since the circuit operation at the time that the input signal rises, is described above, an initial input voltage becomes 0V. In the present embodiment, a sense level of the inverter 13 is regarded as being set to a level higher than 0.8V.

Since the semiconductor integrated circuit is in normal operation, the voltage applied to the reference voltage supply terminal REF is 0.8V. Therefore, the signal N2 is brought to a low level. When the signal N2 is low in level, the P-MOS 1 is brought into an ON state and the N-MOS 7 is brought into an OFF state. Further, since the voltage applied to the input terminal IN is 0V, the signal N1 becomes a voltage level near an H level ($V_{DD}$ level) corresponding to a difference between the voltage applied to the input terminal IN and the voltage applied to the reference voltage supply terminal REF. As a result, the voltage at the output terminal OUT is brought to an L level (during a time interval indicated by $t_1$ in FIG. 2). At this time, the total current used up by the input buffer circuit becomes the sum of a current i1 which flows through the sense circuit S, a current which flows through the inverter 13 and a current which flows through the inverter circuit INV (corresponding to a portion comprised of the P-MOS 8 and the N-MOSs 9 and 10).

The reason why the current flows in the inverter 13 is as follows. Namely, since 0.8V is applied to the input of the inverter 13, the N-MOS of the inverter 13 is in a weak ON state (corresponding to a state of being not completely turned OFF) (the threshold value of the N-MOS is about 0.7V and is not so shifted from the voltage (0.8V) supplied to the gate of the inverter 13). Accordingly, a current flows through the inverter 13 from the power source potential $V_{DD}$ to the ground potential $V_{SS}$. Since, however, the output of the inverter 13 becomes substantially the power source potential (3.3V), the N-MOS of the inverter 14 provided at a stage subsequent to the inverter 13 is completely turned ON. Thus, no current flows through the inverter 14 from the power source potential $V_{DD}$ to the ground potential $V_{SS}$.

The reason why the current flows in the inverter circuit INV, is as follows. Namely, there is a case in which each N-MOS in the inverter circuit INV is brought into a weak ON state (corresponding to a state in which it is not completely turned OFF). Accordingly, the current flows through the inverter circuit INV from the power source potential $V_{DD}$ to the ground potential $V_{SS}$.

If the voltage applied to the input terminal IN is changed to 1.2V from the above state, then the signal N1 is rendered low in level and hence the voltage at the output terminal OUT is brought to a high level (during a time interval indicated by $t_2$ in FIG. 2). After the voltage levels at the input terminal IN and the output terminal OUT have been determined, the total current to be used up or consumed by the input buffer circuit becomes the sum of the current i1 and the current that flows in the inverter 13.

A description will now be made of a circuit operation at the time that the voltage at the input terminal IN falls. When the voltage at the input terminal IN is changed to 0V after the elapse of the time interval indicated by $t_2$ in FIG. 2, the signal N1 approaches a high level and hence the voltage at the output terminal OUT is rendered low in level (during a time interval indicated by $t_3$ in FIG. 2). The total current to be consumed by the input buffer circuit becomes identical to that used up during the time interval indicated by $t_1$ in FIG. 2.

The operation of the semiconductor integrated circuit at the time that the current that flows upon deactivation of the semiconductor integrated circuit is measured, will now be described. In the present invention, the voltage at the reference voltage supply terminal REF will be set as the power source potential when the current is measured upon deactivation of the semiconductor integrated circuit. Thus, since the signal N2 becomes high in level, the P-MOS 1 and the N-MOS 7 are respectively turned OFF and ON. Since the P-MOS 1 is in the OFF state, the current i1 does not flow in the sense circuit S. Further, since the N-MOS 7 is in the ON state, the level of an input applied to the inverter circuit INV is fixed to the ground potential. As a result, no current flows through the inverter circuit INV from the power source potential $V_{DD}$ to the ground potential $V_{SS}$. Namely, the current consumed by the inverter circuit INV is not produced (during a time interval indicated by $t_4$ in FIG. 2).

During the interval indicated by t4 in FIG. 2, the current that flows upon deactivation of the semiconductor integrated circuit is measured in the following manner.

A power source potential $V_{DD}$ is first supplied to a power pin for supplying the power source potential $V_{DD}$ (about 3.3V) to the semiconductor integrated circuit from an external tester. Now, the external tester monitors a current that flows in the semiconductor integrated circuit. The monitored current corresponds to the current that flows upon deactivation of the semiconductor integrated circuit.

When the value of the current is larger than a predetermined value, there is a strong likelihood that a failure occurs in the inside of the semiconductor integrated circuit. Thus, since the current that flows upon normal operation, can be cut off, the failure in the inside of the semiconductor integrated circuit can be easily detected.

In the aforementioned description of operation, the method of measuring the current that flows when the semiconductor integrated circuit is deactivated after the normal operation, is adopted as one example. This is however nothing but one example. It is needless to say that the current may be measured before the normal operation (respective embodiments to be described later are also the same to above).

According to the first embodiment as described above, the P-MOS 1 and the N-MOS 7 can be respectively brought into the OFF and ON states by setting the voltage applied to the reference voltage supply terminal REF to the power source voltage. It is therefore possible to stop the flow of the current in the sense circuit S and to stop the flow of the current consumed by the inverter circuit INV provided at the stage subsequent to the sense circuit S. Thus, the current flowing upon deactivation of the semiconductor integrated circuit can be accurately measured upon test prior to shipment of the semiconductor integrated circuit. Therefore, when one finds a damaged portion on a transistor, a decision made as to whether the semiconductor integrated circuit is defective, becomes easy.

[SECOND EMBODIMENT]

Figure 3:
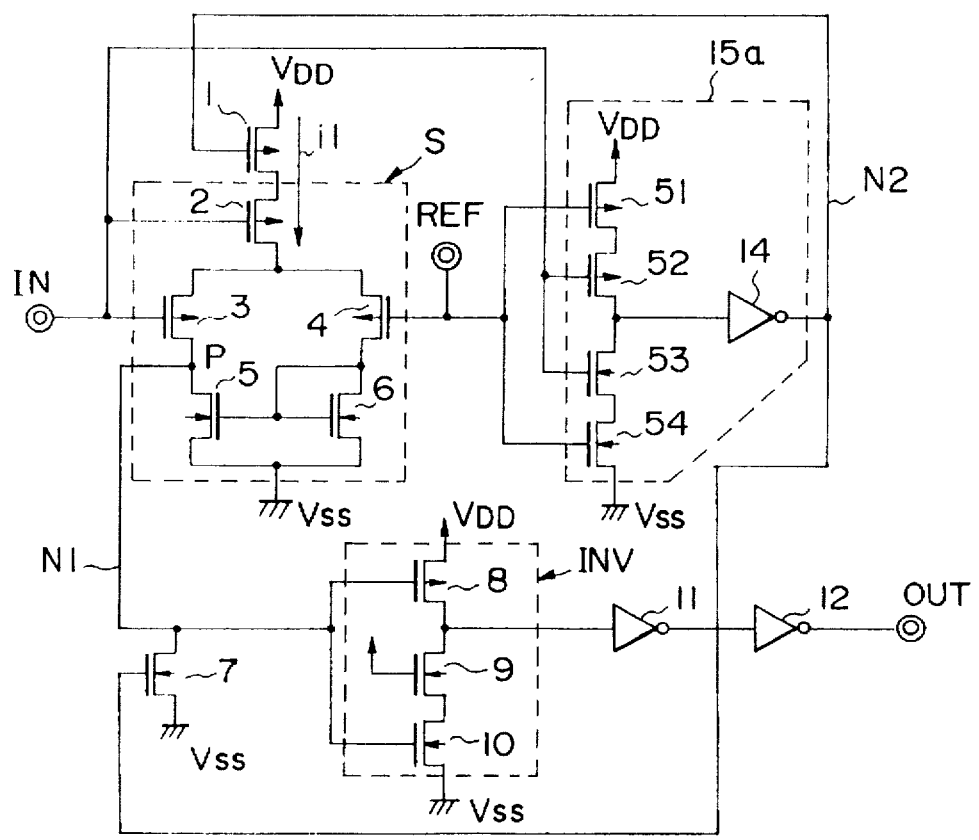
FIG. 3 is a view illustrating a second embodiment of the present invention.

FIG. 3 is a circuit diagram showing a second embodiment of the present invention. In the second embodiment, the inverter 13 described in the first embodiment is constructed as follows.

Namely, (1) A P-MOS 51 used as a third switching element or device and an N-MOS 54 used as a fourth switching device are provided which are respectively disposed between a power source potential $V_{DD}$ and a ground potential $V_{SS}$ and turned ON and OFF complementary to one another. Both gates of the P-MOS 51 and the N-MOS 54 are respectively electrically connected to a reference voltage supply terminal REF. (2) A P-MOS 52 used as a fifth switching element or device and an N-MOS 53 used as a sixth switching device are provided which are respectively disposed between the P-MOS 51 and N-MOS 54 and turned ON and OFF complementary to one another. Both gates of the P-MOS 52 and the N-MOS 53 are respectively electrically connected to an input terminal IN and the input of an inverter 14. A detailed relationship of electrical connections among these MOSs 51 through 54 is as follows. The gates of the P-MOS 51 and the N-MOS 54 are respectively electrically connected to the reference voltage supply terminal REF. The gates of the P-MOS 52 and the N-MOS 53 are respectively electrically coupled to the input terminal IN. The source of the P-MOS 51 is electrically connected to the power source potential, whereas the drain thereof is electrically connected to the source of the P-MOS 52. The drain of the P-MOS 52 is electrically connected to the drain of the N-MOS 53. The source of the N-MOS 53 is electrically connected to the drain of the N-MOS 54. Further, the source of the N-MOS 54 is electrically connected to the ground potential.

Figure 4:
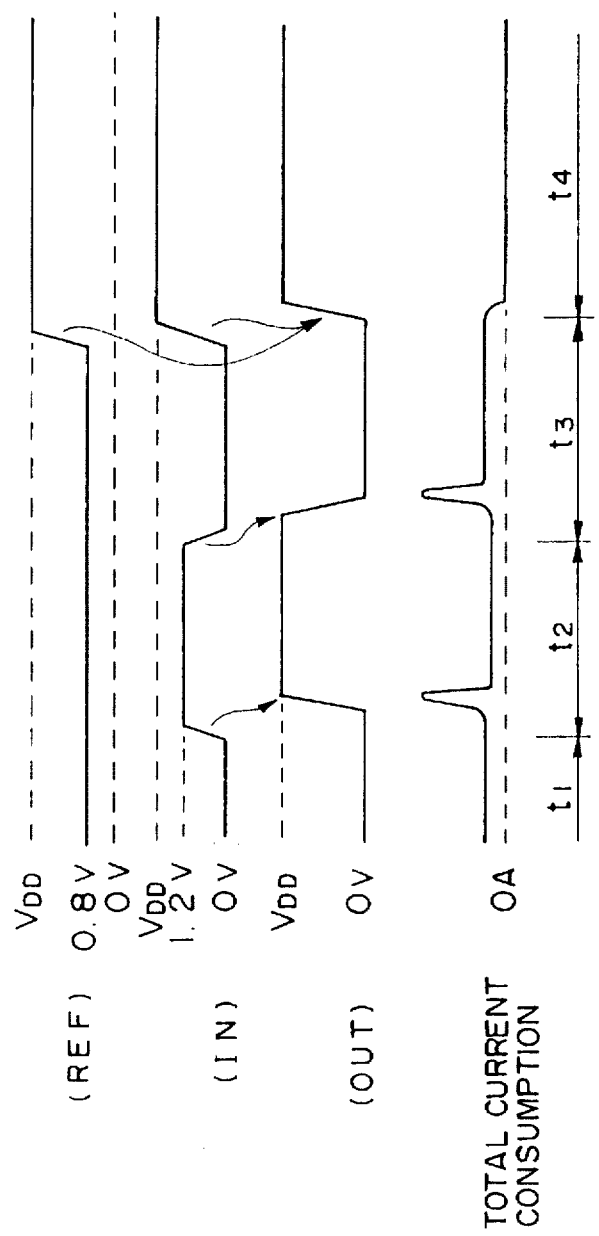
FIG. 4 is a timing chart for describing the operation of the second embodiment of the present invention.

The operation of the semiconductor integrated circuit according to the second embodiment and a method of measuring a current which flows upon deactivation of the semiconductor integrated circuit will now be described with reference to FIGS. 3 and 4. FIG. 4 is a timing chart for describing the operation of the circuit shown in FIG. 3. FIG. 4 also shows the manner in which a current consumed by the circuit varies with time.

Circuit operations at the time that an input signal rises and falls when the semiconductor integrated circuit is normally activated (during times $t_1$ to $t_3$), are basically identical to those in the first embodiment. However, the total current to be consumed after voltages at the input terminal IN and an output terminal OUT have been determined, is slightly different from that described in the first embodiment during the times $t_1$ and $t_3$. Namely, since the N-MOS 53 is brought into an OFF state when the level of an input applied to the input terminal IN is low, no current flows in the P-MOSs 51, 52 and the N-MOSs 53 and 54. Thus, the total current used up by the semiconductor integrated circuit during the times t1 and t3 becomes equal to the sum of a current i1 that flows in a sense circuit S and a current that flows through an inverter circuit INV. Namely, since the N-MOS 53 is turned OFF when the input signal applied to the input terminal IN is of a low level (0V) upon normal operation in the second embodiment, an advantageous effect can be brought about which is capable of eliminating a current consumed by a controller 15a at the time that the input signal applied to the input terminal IN is low in level. Incidentally, the P-MOS 52 contributes to a reduction in current consumed by the controller 15a when the input signal is high in level.

The operation of the semiconductor integrated circuit at the time that the current that flows upon deactivation of the semiconductor integrated circuit is measured, will now be described. When the voltages applied to the input terminal IN and the reference voltage supply terminal REF are respectively set as the power source potential $V_{DD}$ (about 3.3V), a signal N2 is rendered high in level, a P-MOS 1 is brought into an OFF state and an N-MOS 7 is brought into an ON state. As a result, a signal N1 is rendered low in level. Therefore, no current flows in the sense circuit S, the P-MOSs 51 and 52, the N-MOSs 53 and 54 and the inverter circuit INV.

According to the second embodiment as described above, the P-MOS 1 and the N-MOS 7 can be respectively turned OFF and ON by setting the voltages applied to the input terminal IN and the reference voltage supply terminal REF to the power source voltage in the same manner as described in the first embodiment. Therefore, the current i1 can be prevented from flowing in the sense circuit S. Further, since the input supplied to the inverter circuit INV can be fixed to the low level, no current flows in the inverter circuit INV. Thus, the current flowing upon deactivation of the semiconductor integrated circuit can be accurately measured upon test at the shipment of the semiconductor integrated circuit. Therefore, when one finds a damaged portion on a transistor, a decision made as to whether the semiconductor integrated circuit is defective, becomes easy.

In particular, the second embodiment can bring about an advantageous effect that since the N-MOS 53 is in the OFF state when the signal inputted to the input terminal IN is of the low level (0V) upon normal operation, the current consumed by the controller 15a at the time that the input signal is of the low level (0V), can be eliminated.

[THIRD EMBODIMENT]

Figure 5:
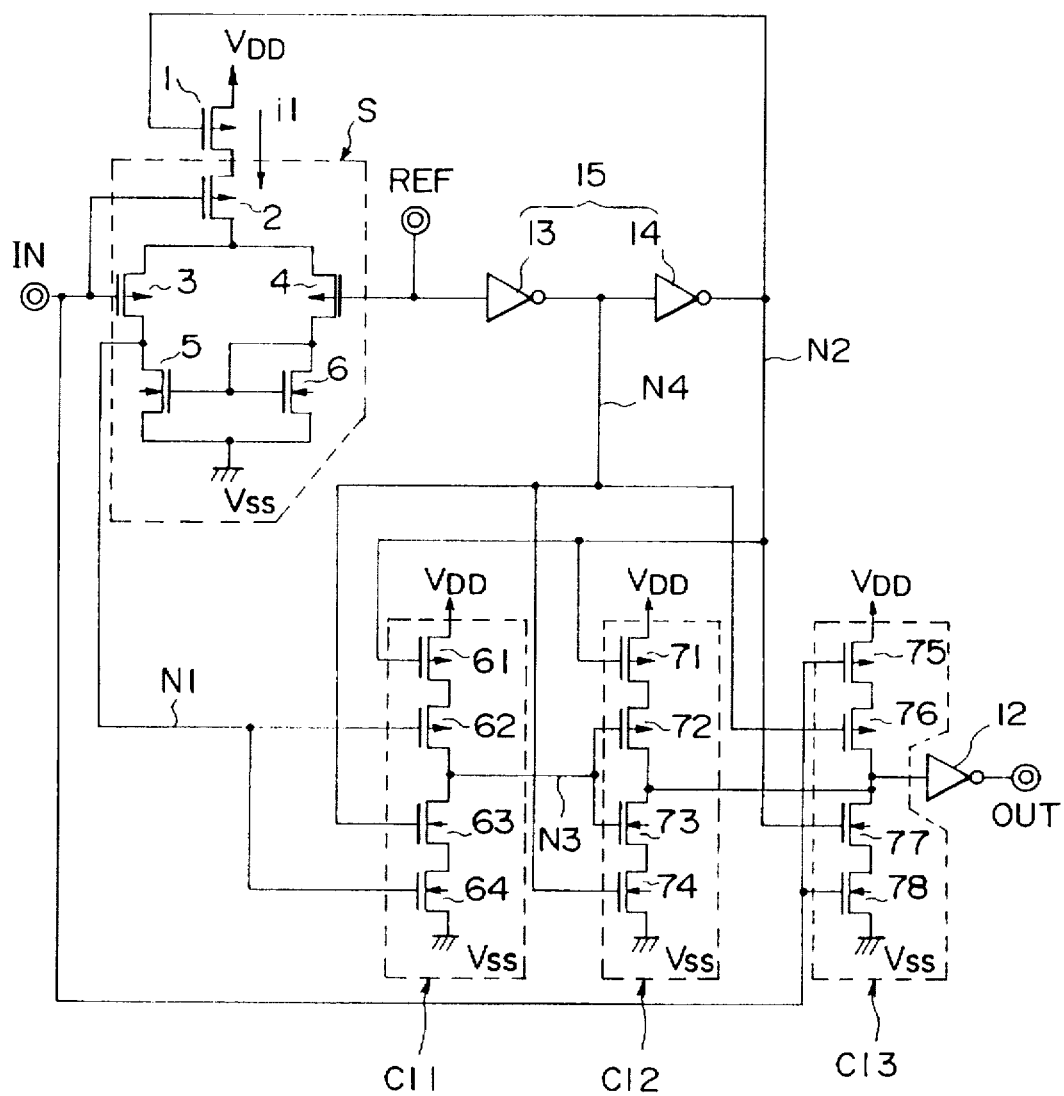
FIG. 5 is a view depicting a third embodiment of the present invention.

FIG. 5 is a circuit diagram showing a semiconductor integrated circuit according to a third embodiment of the present invention.

The semiconductor integrated circuit according to the third embodiment includes a sense circuit S, a first switching element or device 1 and a controller 15 in a manner similar to the first embodiment. The semiconductor integrated circuit further includes a first clocked inverter Cl1 electrically connected to the output of the sense circuit S, a second clocked inverter Cl2 electrically connected to the output of the first clocked inverter and a third clocked inverter Cl3 electrically connected to the output of the second clocked inverter Cl2 and an input terminal IN. Whether each of the first through third clocked inverters Cl1 through Cl3 is brought into an inverting state or a high impedance state, is controlled based on a voltage applied to a reference voltage supply terminal REF. When the first and second clocked inverters Cl1 and Cl2 are respectively brought into the inverting state, for example, the third clocked inverter Cl3 is brought into the high impedance state. On the other hand, when the first and second clocked inverters Cl1 and Cl2 are respectively brought into the high impedance state, the third clocked inverter Cl3 becomes the inverting state. The first clocked inverter Cl1 comprises P-MOSs 61 and 62 and N-MOSs 63 and 64 all of which are connected in series. The second clocked inverter Cl2 comprises P-MOSs 71 and 72 and N-MOSs 73 and 74 all of which are connected in series. The third clocked inverter Cl3 comprises P-MOSs 75 and 76 and N-MOSs 77 and 78 all of which are connected in series. A description will now be made of a detailed relationship of electrical connections made within the semiconductor integrated circuit shown in FIG. 5.

The electrical connections among the input terminal IN, the sense circuit S, the reference voltage supply terminal REF and the controller 15 are the same as those in the first embodiment. The input terminal IN is electrically connected to both gates of P-MOSs 2 and 3 in the sense circuit S and both gates of the P-MOS 75 and the N-MOS 78 in the third clocked inverter Cl3. In the first clocked inverter Cl1, the source of the P-MOS 61 is electrically connected to a power source potential $V_{DD}$. The gate of the P-MOS 61 is supplied with a signal N2 and the drain thereof is electrically connected to the source of the P-MOS 62. Further, the gate of the P-MOS 62 is supplied with a signal N1 and the drain thereof is electrically connected to the drain of the P-MOS 63. A signal, which appears at the drain of the P-MOS 63, is used as N3. The gage of the N-MOS 63 is electrically connected to the output (signal N4) of an inverter 13 and the source thereof is electrically connected to the drain of the N-MOS 64. The gate of the N-MOS 64 is supplied with the signal N1 and the source thereof is electrically connected to a ground potential. In the second clocked inverter Cl2, the source of the P-MOS 71 is electrically connected to the power source potential $V_{DD}$ and the drain thereof is electrically connected to the source of the N-MOS 72. The gate of the P-MOS 71 is supplied with the signal N2. The gate of the N-MOS 72 is supplied with the signal N3 and the drain thereof is electrically connected to the drain of the N-MOS 73 and the input of an inverter 12. Further, the gate of the N-MOS 73 is supplied with the signal N3 and the source thereof is electrically connected to the drain of the N-MOS 74. The gate of the N-MOS 74 is supplied with the signal N4 and the source thereof is electrically connected to the ground potential. In the third clocked inverter Cl3, the source of the P-MOS 75 is electrically connected to the power source potential $V_{DD}$ and the drain thereof is electrically connected to the source of the P-MOS 76. The gate of the P-MOS 76 is supplied with the signal N4 and the drain thereof is electrically connected to the drain of the N-MOS 77 and the input of the inverter 12. Further, the gate of the N-MOS 77 is supplied with the signal N2 and the source thereof is electrically connected to the drain of the N-MOS 78. The source of the N-MOS 78 is electrically connected to the ground potential. The output of the inverter 12 is electrically connected to an output terminal OUT.

The operation of the semiconductor integrated circuit according to the third embodiment will now be described.

A description will first be made of circuit operations at the time that an input signal rises and falls when the semiconductor integrated circuit is normally operated. Since the voltage applied to the reference voltage supply terminal REF is 0.8V upon normal operation, the signal N2 (see FIG. 5) is rendered low in level. Further, the P-MOSs 1, 61 and 71 supplied with the signal N2 and the N-MOSs 63 and 74 supplied with the signal N4 are respectively turned ON and the P-MOS 76 and the N-MOS 77 are turned OFF. The circuit operations and current to be used up by the semiconductor integrated circuit are identical to those shown during the times t1 to t3 as already described in the first embodiment.

A description will next be made of a circuit operation at the time that a current which flows upon deactivation of the semiconductor integrated circuit, is measured. When the level of the voltage applied to the reference voltage supply terminal REF is set to the power source potential $V_{DD}$, the signal N4 is rendered low in level and the signal N2 is brought to a high level. Further, the P-MOSs 1, 61 and 71 supplied with the signal N2 and the N-MOSs 63 and 74 supplied with the signal N4 are respectively turned OFF and the P-MOS 76 and the N-MOS 77 are turned OFF. As a result, a current i1, a current consumed by the inverter 13, a current consumed by the P-MOSs 61 and 62 and the N-MOSs 63 and 64 and a current consumed by the P-MOSs 71 and 72 and the N-MOSs 73 and 74 are all cut off. In this condition, the signal supplied to the input terminal IN is sent to the output terminal OUT through the third clocked inverter Cl3 and the inverter 12.

Figure 6:
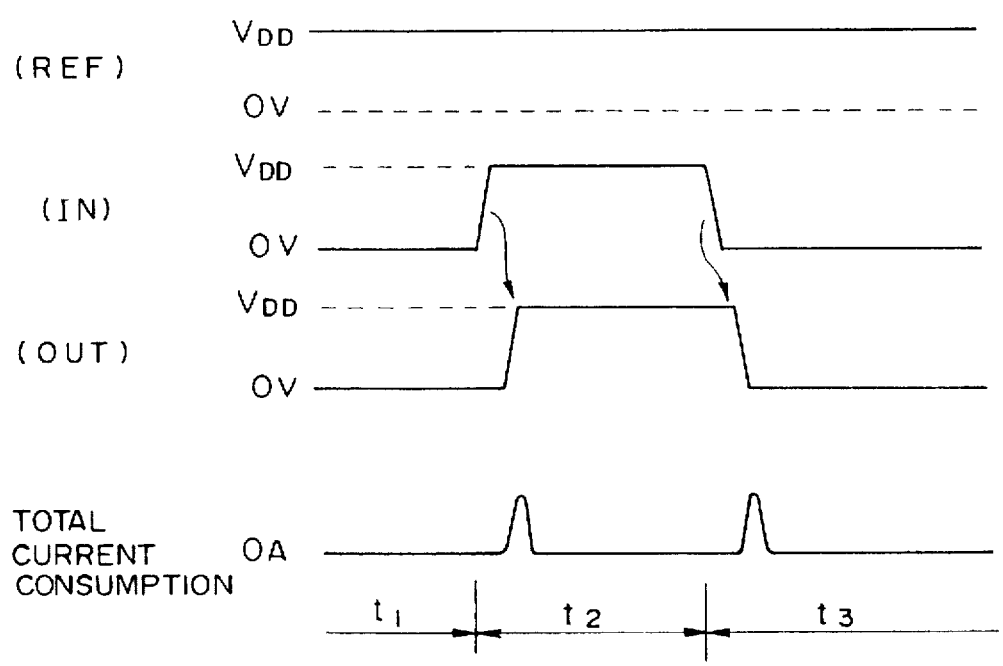
FIG. 6 is a timing chart for explaining the operation of the third embodiment of the present invention.

The operation of the third clocked inverter Cl3 at the time that the input signal applied to the input terminal IN rises and falls, is as follows. This operation will be described with reference to FIGS. 5 and 6. Since the signal supplied to the input terminal IN is low in level when the signal firstly rise, the P-MOS 75 is turned ON and the N-MOS 78 is turned OFF. Thus, the voltage at the output terminal OUT is brought to a low level (during a time $t_1$ in FIG. 6). When the signal applied to the input terminal IN is changed to a high level from this condition, the P-MOS 75 is turned OFF and the N-MOS 78 is turned ON, so that the voltage at the output terminal OUT is rendered high in level (during a time $t_2$ in FIG. 6). A description will next be made of the operation of the third clocked inverter Cl3 at the time that the signal inputted to the input terminal IN falls. When the signal applied to the input terminal IN is changed to the low level from the time $t_2$, the P-MOS 75 and the N-MOS 78 are respectively turned ON and OFF, so that the voltage at the output terminal OUT is brought to a low level (during a time $t_3$).

According to the third embodiment as described above, since the P-MOSs 1, 61 and 71 and the N-MOSs 63 and 74 are turned OFF by setting the voltage at the reference voltage supply terminal REF to the power source voltage upon measurement of the current that flows when the semiconductor integrated circuit is deactivated, the current i1 flowing in the sense circuit S can be eliminated and the current consumed by the circuit provided at the stage subsequent to the sense circuit S can be also cut off. Further, since the amplitude of the voltage applied to the input terminal IN is set so as to range from 0~1.2V to 0~the power source voltage (3.3V) in the third embodiment, the signal supplied to the input terminal IN can be sent to the output terminal OUT in the form of a logical value identical to that set upon normal operation without being transmitted through the sense circuit S. Namely, the function of the signal supplied to the input terminal IN can be also tested simultaneously.

[FOURTH EMBODIMENT]

Figure 7:
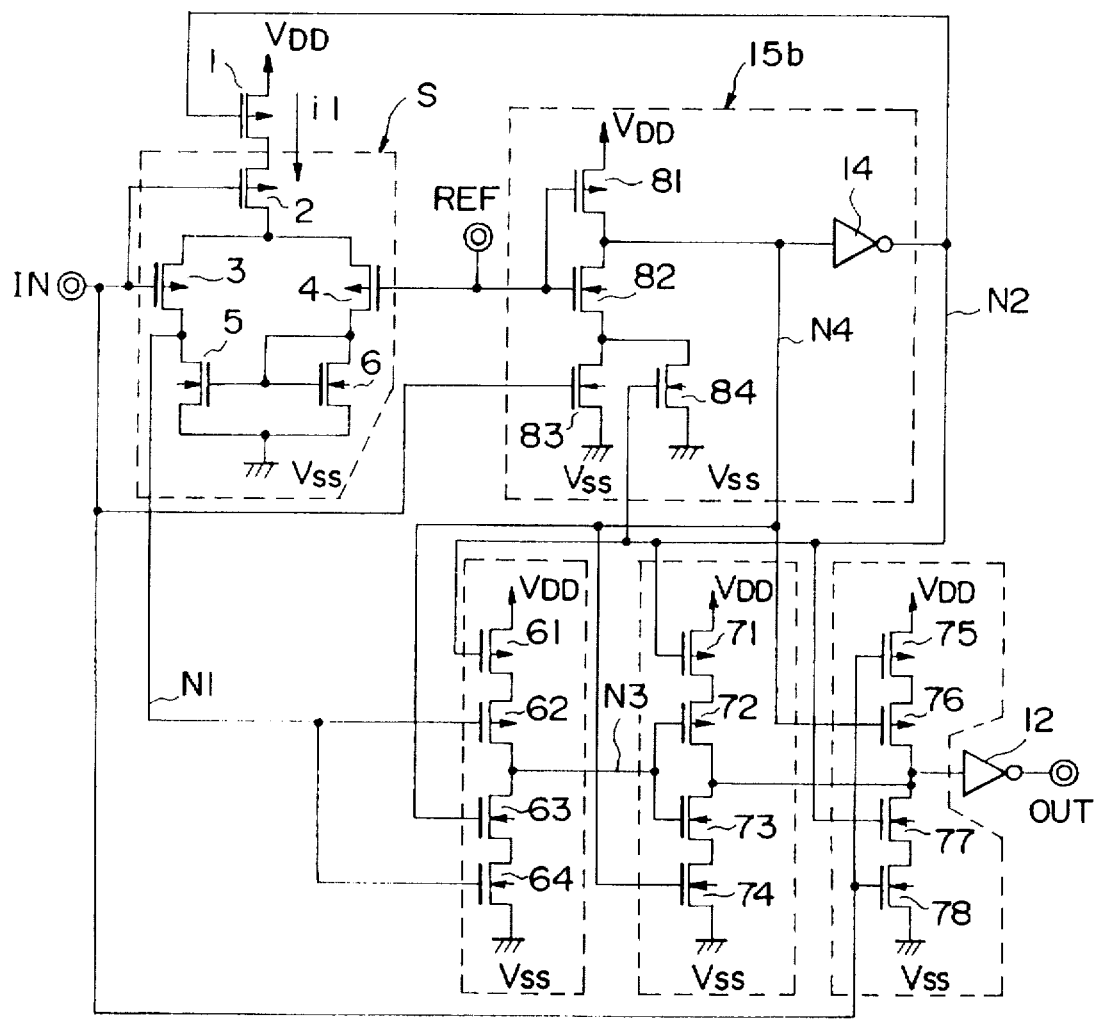
FIG. 7 is a view showing a fourth embodiment of the present invention.

FIG. 7 is a circuit diagram showing an input buffer circuit employed in a semiconductor integrated circuit according to a fourth embodiment of the present invention. The fourth embodiment is characterized by a circuit to be next described provided as an alternative to the inverter 13 employed in the configuration of the third embodiment. Namely, (1) The circuit has a P-MOS 81 used as a seventh switching element or device and an N-MOS 82 used as an eighth switching device both of which are connected in series with each other and actuated complementary to each other. Control terminals (gates) of the P-MOS 81 and the N-MOS 82 are electrically connected to a reference voltage supply terminal REF. Further, the source of the P-MOS 81 is electrically connected to a power source potential $V_{DD}$. (2) The circuit includes an inverter 14 whose input is electrically connected to a point at which the seventh and eighth switching devices 81 and 82 are connected to each other, and N-MOSs 83 and 84 used as ninth and tenth switching devices both of which are provided in parallel between the drain of the N-MOS 82 and a ground potential $V_{SS}$. A control electrode (gate) of the ninth switching device 83 is electrically connected to an input terminal IN and a control electrode (gate) of the tenth switching device 84 is electrically connected to the output of an inverter 14. A further description will be made of a detailed relationship of electrical connections made within the above circuit.

The gate of the P-MOS 81 used as the seventh switching device and the gate of the N-MOS 82 used as the eight switching device are electrically connected to the reference voltage supply terminal REF. Further, the source of the P-MOS 81 is electrically connected to the power source potential $V_{DD}$ and the drain thereof is electrically connected to the drain of the N-MOS 82. A signal, which appears at the drain of the P-MOS 81, is set as N4. The source of the N-MOS 82 is electrically connected to the drains of the N-MOSs 83 and 84. Further, the gate of the N-MOS 83 is electrically connected to the input terminal IN and the source thereof is electrically connected to the ground potential $V_{SS}$. Furthermore, the gate of the N-MOS 84 is supplied with a signal N2 outputted from the inverter 14 and the source thereof is electrically connected to the ground potential $V_{SS}$.

The operation of the semiconductor integrated circuit according to the fourth embodiment will be described. A description will be first made of a normal operation thereof. Since the voltage applied to the reference voltage supply terminal REF is 0.8V, the signal N4 is brought to a high level and the signal N2 is brought to a low level. Further, each of P-MOSs 1, 61 and 71 and N-MOSs 63 and 74 is in an ON state and each of a P-MOS 76 and N-MOSs 77 and 84 is in an OFF state. Circuit operations at the time that the signal inputted to the input terminal IN rises and falls in this condition are similar to those made during the times t1 to t3 in FIG. 4 which has been described in the second embodiment. Thus, since the N-MOS 83 is kept OFF when the voltage applied to the input terminal IN is 0V, no current is consumed by the P-MOS 81 and the N-MOSs 82, 83 and 84.

Figure 8:
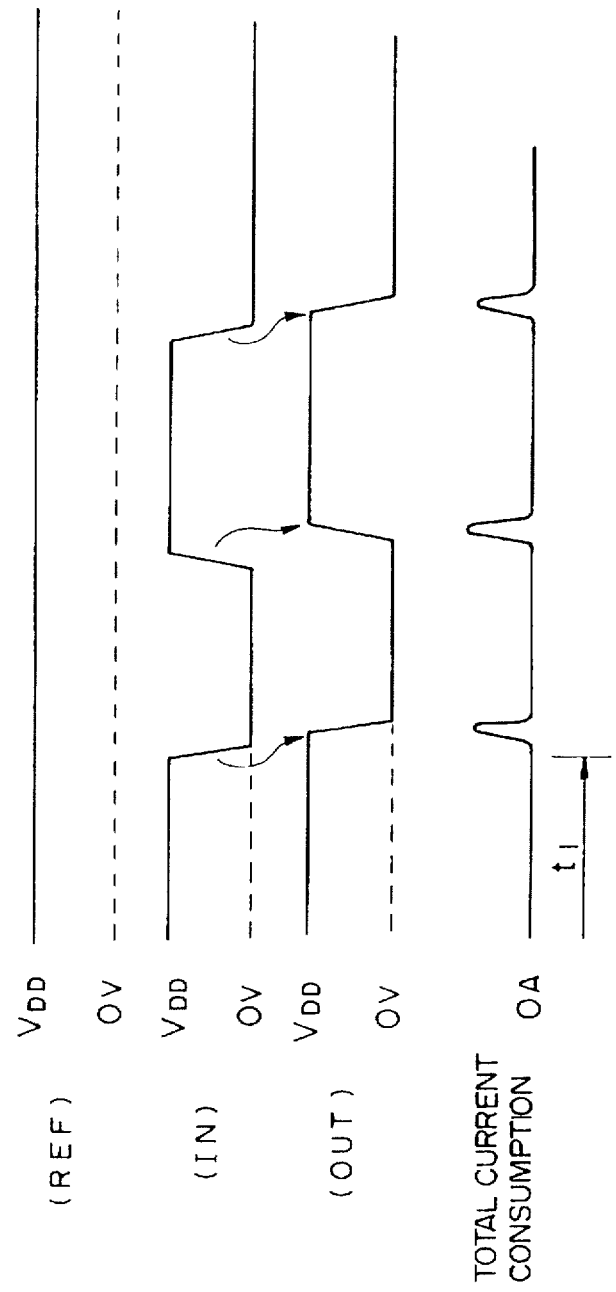
FIG. 8 is a timing chart for describing the operation of the present invention.

A circuit operation at the time that a current which flows upon deactivation of the semiconductor integrated circuit, is measured, will next be described with reference to FIG. 8. When the reference voltage supply terminal REF is first set to the power source potential $V_{DD}$, the P-MOS 81 is turned OFF and the N-MOS 82 is turned ON. When the N-MOS 84 is now in an OFF state, the signal N4 is brought into a floating state. If, however, the input terminal IN is set to the power source voltage, then the N-MOS 83 is turned ON so that the signal N4 is rendered low in level. In doing so, the signal N2 is brought to a high level and hence the N-MOS 84 is finally brought into an ON state (during the time $t_1$). The signal N4 is fixed to a low level from the result of the above operation. Thus, the present circuit can be activated from this condition as has been described with reference to FIG. 6.

According to the semiconductor integrated circuit of the fourth embodiment as described above, since the P-MOSs 1, 61 and 71 and the N-MOSs 63 and 74 are turned OFF by setting the voltage at the reference voltage supply terminal REF and the voltage at the input terminal IN to the power source voltage upon measurement of the current that flows when the semiconductor integrated circuit is deactivated, a current i1 can be prevented from flowing in a sense circuit S and a current consumed by a circuit provided at the stage subsequent to the sense circuit S can be also cut off. Further, since the amplitude of the voltage applied to the input terminal IN is set so as to range from 0~1.2V to 0~the power source voltage, the signal supplied to the input terminal IN can be sent to the output terminal OUT in the form of a logical value identical to that set upon normal operation. Accordingly, the function of the signal given to the input terminal IN can be also tested simultaneously.

When the voltage at the input terminal IN is 0V upon normal operation, the effects of the N-MOSs 83 and 84 cut off the flow of the current through the P-MOS 81 and the N-MOSs 82, 83 and 84.

[FIFTH EMBODIMENT]

Figure 9:
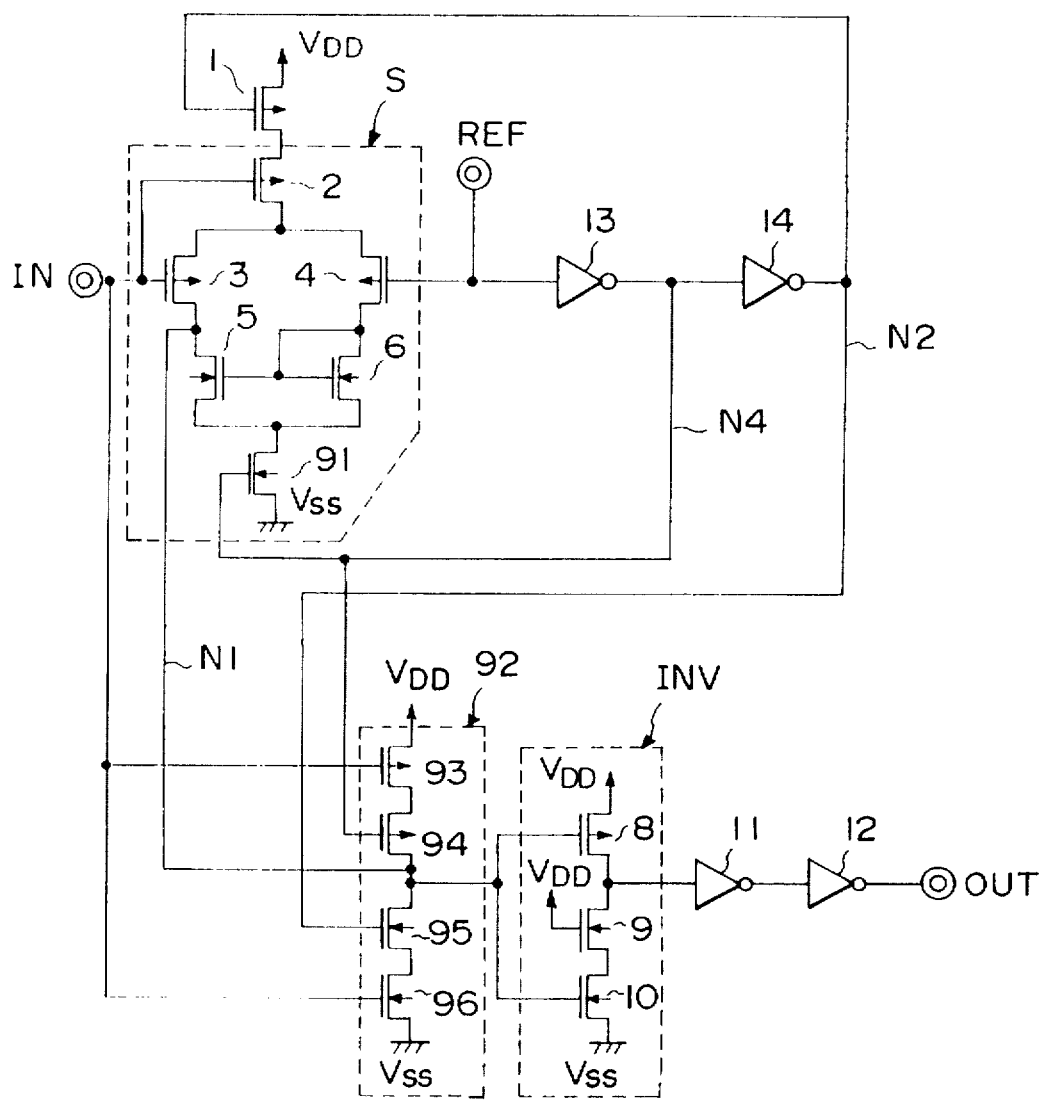
FIG. 9 is a view illustrating a fifth embodiment of the present invention.
Figure 10:
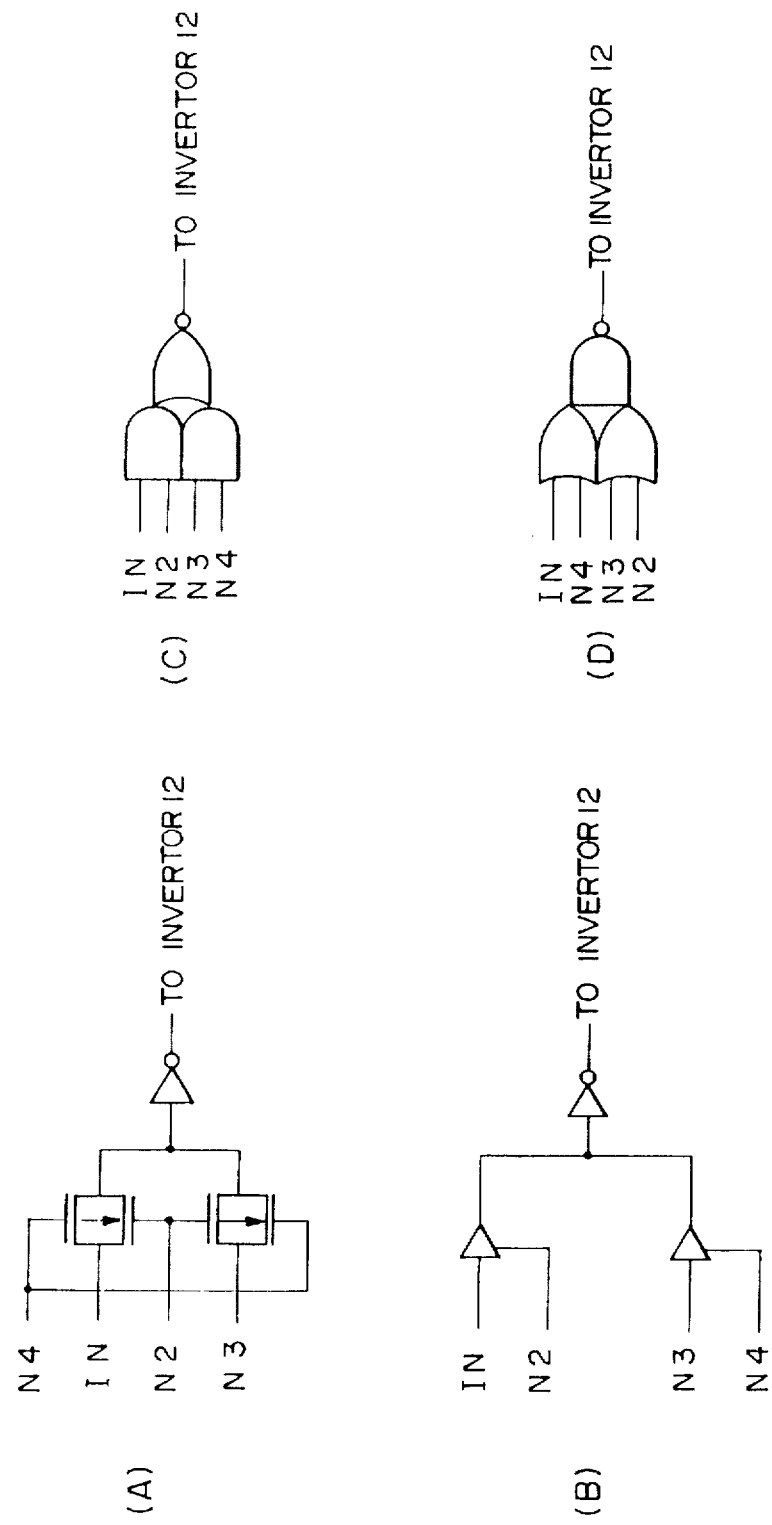
FIG. 10 is a view showing modifications of the individual embodiments of the present invention.

FIG. 9 is a circuit diagram principally illustrating an input buffer circuit employed in a semiconductor integrated circuit according to a fifth embodiment of the present invention. In the fifth embodiment, as an alternative to the direct connection of grounding portions (sources in the present embodiment) of transistors (N-MOS 5 and N-MOS 6 in the present embodiment) serving as resistive elements in a sense circuit, to a ground potential, a switching element or device 91 (hereinafter called "ground-side switching device 91") is electrically connected between the portions to be grounded and the ground potential. A control terminal of the ground-side switching device 91 is electrically connected to a reference voltage supply terminal REF through an inverter 13. There is also provided a clocked inverter 92 electrically connected to both the output (signal N1) of the sense circuit S and an input terminal IN. The clocked inverter 92 is controlled whether it is brought into an inverting state or a high impedance state according to a voltage supplied to the reference voltage supply terminal REF. The clocked inverter 92 is brought into the high impedance state when a first switching element or device 1 and the ground-side switching device 91 are turned ON. On the other hand, when the first switching device 1 and the ground-side switching device 91 are turned OFF, the clocked inverter 92 is brought into the inverting state. The clocked inverter 92 comprises P-MOSs 93 and 94 and N-MOSs 95 and 96 all of which are electrically connected in series with one another. The relationship of electrical connections in the circuit shown in FIG. 9 will be described below in detail.

The input terminal IN is electrically connected to both gates of P-MOSs 2 and 3 and both gates of the P-MOS 93 and the N-MOS 96 in the clocked inverter 92. In the clocked inverter 92, the source of the P-MOS 93 is electrically connected to a power source potential $V_{DD}$, the gate thereof is electrically connected to the input terminal IN and the drain thereof is electrically connected to the source of the P-MOS 94. Further, the gate of the P-MOS 94 is supplied with a signal N4 and the drain thereof is electrically connected to the drain of the N-MOS 95. A common point or node at which the drain of the P-MOS 94 and the drain of the N-MOS 95 are coupled to each other, is electrically connected to the input of an inverter circuit INV. Furthermore, the gate of the N-MOS 95 is supplied with a signal N2 and the source thereof is electrically connected to the drain of the N-MOS 96. The source of the N-MOS 96 is electrically connected to the ground potential. Still further, the source of a P-MOS 8 in the inverter circuit INV is electrically connected to the power source potential $V_{DD}$ and the drain thereof is electrically connected to the drain of an N-MOS 9 and the input of an inverter 11. The gate of the N-MOS 8 is supplied with the signal N1. The gate of the N-MOS 9 is electrically connected to the power source potential and the source thereof is electrically coupled to the drain of an N-MOS 10. The gate of the N-MOS 10 is supplied with the signal N1 and the source thereof is electrically connected to the ground potential. The output of the inverter 11 is electrically connected to the input of an inverter 12 and the output of the inverter 12 is electrically connected to an output terminal OUT.

The operation of the circuit according to the fifth embodiment will now be described below. Since the reference voltage supply terminal REF is maintained at 0.8V upon normal operation, the signal N4 is brought to a high level and the signal N2 is brought to a low level. Thus, the P-MOS 1 used as the first switching device and the N-MOS 91 used as the ground-side switching device are respectively kept ON and OFF. Therefore, the signal supplied to the input terminal IN is transmitted to the output terminal OUT through the sense circuit S.

A description will now be made of a circuit operation at the time that a current that flows upon deactivation of the semiconductor integrated circuit, is measured. When the reference voltage supply terminal REF is set to the power source potential $V_{DD}$, the signals N4 and N2 are respectively brought to low and high levels. As a result, the P-MOS 1 serving as the first switching device and the N-MOS 91 serving as the ground-side switching device 91 are turned OFF and the P-MOS 94 and the N-MOS 95 are turned ON. Therefore, the signal supplied to the input terminal IN is sent to the output terminal OUT through the clocked inverter 92 composed of the P-MOSs 93 and 94 and the N-MOSs 95 and 96. Thus, the circuit according to the fifth embodiment can be activated in a manner similar to that according to the third embodiment. Moreover, this operation can be carried out by transistors fewer in number than those employed in the third embodiment.

[MODIFICATIONS]

(1) The P-MOS 52 employed in the second embodiment may be deleted. This is because the P-MOS 52 may not be provided basically since it is intended to reduce the current flowing through the controller 15a when the input signal is high in level.

(2) The circuit section composed of the P-MOSs 61 and 62 and the N-MOSs 63 and 64 in the circuit (see FIG. 5) according to the third embodiment may be replaced by the circuit comprised of the P-MOS 8 and the N-MOSs 7, 9 and 10 shown in FIG. 1.

(3) Each circuit section comprised of the P-MOSs 71, 72, 75, 76 and the N-MOSs 73, 74, 77 and 78 both shown in FIGS. 5 and 7, may be replaced by each of various selector circuits shown in FIGS. 10(A), 10(B), 10(C) and 10(D). When it is desired to replace the circuit section by each selector circuit, portions indicated by symbols IN, N2, N3 and N4 in FIG. 10 may be connected to portions indicated by symbols IN, N2, N3 and N4 in FIGS. 5 and 7.

(4) Each of the embodiments has shown, as an example, the case where the control terminal (gate) of the first switching device 1 provided between the sense circuit S and the power source potential is connected to the reference voltage supply terminal REF through the inverter 13 or 14. However, if the control terminal (gate) of the first switching device 1 can be driven based on the signal supplied to the reference voltage supply terminal REF, then the first switching device 1 may be directly connected to the reference voltage supply terminal REF. This is because a higher-speed operation can be carried out.

Figure 11:
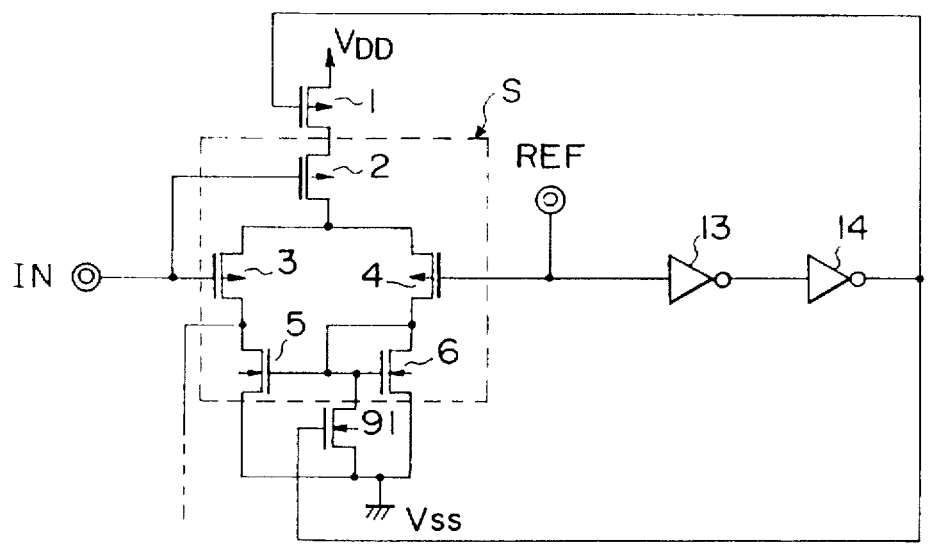
FIG. 11 is a view depicting a modification of the fifth embodiment of the present invention.

(5) The fifth embodiment has shown the case where the portions (sources) to be grounded of the transistors (N-MOS 5 and N-MOS 6) serving as the resistive elements in the sense circuit S are connected to the ground potential through the ground-side switching device 91. However, as shown in FIG. 11, the grounding portions (sources) of the N-MOS 5 and the N-MOS 6 is directly connected to the ground potential and thereafter the ground-side switching device 91 may be provided between the control terminals of the N-MOSs 5 and 6 and the ground potential. This improves the operating speed of the input buffer circuit at the time of the normal operation.

Figure 12:
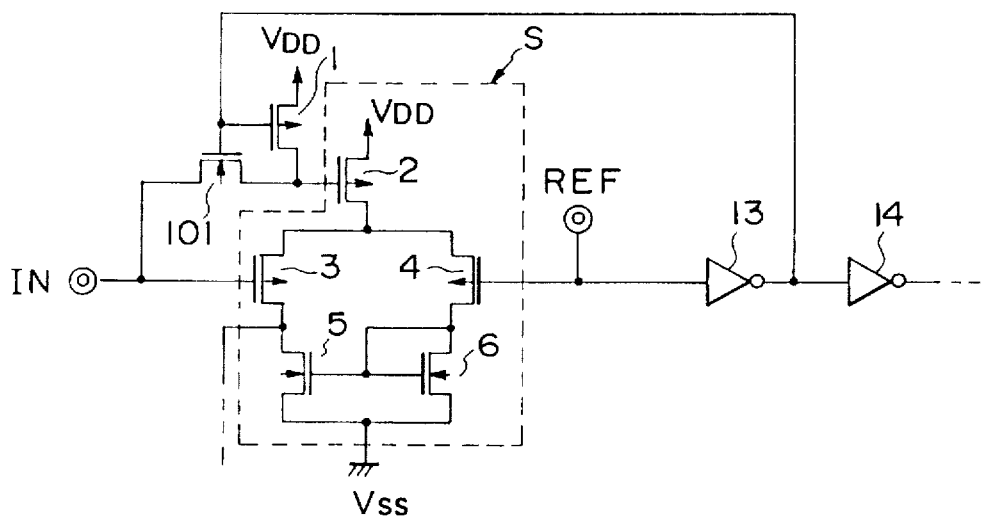
FIG. 12 is a view illustrating a modification of each embodiment of the present invention.
Figure 13:
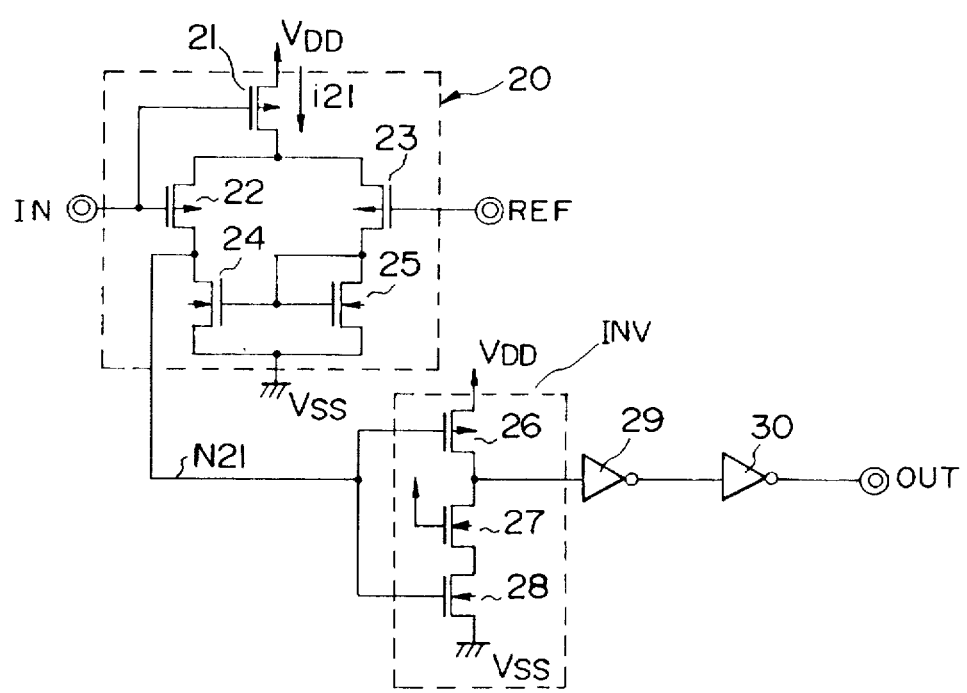
FIG. 13 is a view for describing a technique related to the present invention.

(6) In the individual embodiments described above, the source of the P-MOS 1 used as the first switching device is connected to the power source voltage $V_{DD}$. Further, the drain of the P-MOS 1 is connected to the source of the P-MOS 2 that serves as the constant-current power supply for the sense circuit S. Namely, each embodiment has shown, as an example, the case where the first switching device 1 is directly connected to the P-MOS 2 serving as the constant-current power supply for the sense circuit S. However, such a circuit configuration may be set to a circuit configuration shown in FIG. 12. Namely, a first switching device 1 is connected to a control terminal (gate) of a P-MOS 2 which serves as a constant-current power supply for a sense circuit S. Further, an input-side switching device 101 (e.g., N-MOS 101) operated complementary to a P-MOS 1 used as the first switching device and having a control terminal to which a control signal to be supplied to the first switching device 1 is inputted in parallel, is provided between the control terminal of the P-MOS 2 and an input terminal IN. According to this arrangement, the two P-MOSs are not series-connected between a power source potential $V_{DD}$ and the sense circuit S. It is therefore possible to improve the operating speed of the present circuit.

(7) The inverter 13 in the circuit (see FIG. 9) according to the fifth embodiment may be replaced by the circuit section comprised of the transistors 81 through 84 employed in the fourth embodiment.

(8) Each of the aforementioned embodiments shows, as an example, the case where the sense circuit is made up of the P-MOS differential amplifier circuit. However, the sense circuit may be comprised of an N-MOS differential amplifier circuit. In this case, the electrical connections between the sense circuit and both a power source potential and a ground potential are suitably changed.

[APPLICATIONS]

Each of the aforementioned embodiments shows an example in which the present invention is applied to the GTL. However, the present invention can be applied to an input buffer circuit called an ECL or a CTT (Center Tapped Termination) having a differential amplifier circuit.

According to the typical embodiments of the present invention, as are apparent from the above description, the current that flows upon deactivation of each semiconductor integrated circuit, can be reliably measured.

Thus, upon testing prior to shipment of the semiconductor integrated circuit, an easy decision can be made where each transistor has a damage or broken spot.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit comprising:

an input node supplied with an input voltage;

a reference node supplied with a reference voltage;

a first source potential node supplied with a first source potential level;

a second source potential node supplied with a second source potential level;

a sense circuit connected between said first source potential node and said second source potential node and brought into an operating state during a period in which the first source potential level is supplied, said sense circuit comparing the input voltage and the reference voltage and outputting the result of comparison to a first node;

a buffer circuit connected between the first node and an output node, said buffer circuit including first and second stages;

said first stage outputting a voltage corresponding to the voltage supplied to the first node to said second stage when the voltage supplied to said reference node is equal to a level between the first source potential level and the second source potential level and outputting a floating level to said second stage irrespective of the voltage supplied to the first node when the voltage supplied to said reference node is equal to the first source potential level or the second source potential level;

said second stage outputting a voltage outputted from said first stage to the output node when the voltage supplied to said reference node is equal to a level between the first source potential level and the second source potential level and outputting a voltage corresponding to the voltage supplied to said input node to the output node when the voltage supplied to said reference node is equal to the first source potential level or the second source potential level; and a first switching circuit connected between said first source potential node and said sense circuit and adapted to selectively connect between said sense circuit and said first source potential node in response to the voltage supplied to said reference node.

2. A semiconductor integrated circuit according to claim 1, wherein said first switching circuit provides electrical isolation between said sense circuit and said first source potential node when the first source potential level or the second source potential level is supplied to said reference node.

3. A semiconductor integrated circuit according to claim 1, wherein said first switching circuit provides an electrical connection between said sense circuit and said first source potential node when said reference node is supplied with a level between the first source potential level and the second source potential level.

4. A semiconductor integrated circuit according to claim 1, further comprising:

a second switching circuit connected between said second source potential node and said first node and adapted to fix the potential supplied to the first node to the first source potential level or the second source potential level in response to the voltage supplied to said reference node.

5. A semiconductor integrated circuit according to claim 1, further comprising:

a control circuit connected between said reference node and said first switching circuit and adapted to output a voltage corresponding to the voltage supplied to said reference node to said first switching circuit, said control circuit outputting a voltage for allowing said first switching circuit to provide electrical isolation between said sense circuit and said first source potential node when the voltage supplied to said reference node is equal to the first source potential level or the second source potential level.

* * * * *